United States Patent

Burrus, Jr. et al.

[11] 4,040,890
[45] Aug. 9, 1977

[54] NEODYMIUM OXIDE DOPED YTTRIUM ALUMINUM GARNET OPTICAL FIBER

[75] Inventors: Charles Andrew Burrus, Jr., Fair Haven; Julian Stone, Rumson, both of N.J.

[73] Assignee: Bell Telephone Laboratories, Incorporated, Murray Hill, N.J.

[21] Appl. No.: 591,178

[22] Filed: June 27, 1975

[51] Int. Cl.² .................... B01J 17/18; B01J 17/36
[52] U.S. Cl. ........................ 156/605; 156/620; 156/624; 156/DIG. 61; 156/DIG. 63; 156/DIG. 80; 331/94.5 F; 350/96 WG; 423/263; 428/396
[58] Field of Search .......... 156/605, 606, 616, 617, 156/620, 604, 624, DIG. 61, DIG. 63, DIG. 80; 23/305 A, 305 RE; 350/96 WG; 331/94.5 F; 252/301.4 R; 423/263; 428/396; 264/DIG. 19, 25, 165

[56] References Cited

U.S. PATENT DOCUMENTS

| 2,970,111 | 1/1961 | Hoffmann et al. | 156/605 |
| 3,125,532 | 3/1964 | Keller | 156/605 |
| 3,141,849 | 7/1964 | Enk et al. | 156/605 |
| 3,211,654 | 10/1965 | Jacob et al. | 156/605 |
| 3,293,001 | 12/1966 | Spielmann et al. | 156/605 |
| 3,723,599 | 3/1973 | Brandle, Jr. et al. | 156/617 |
| 3,944,640 | 3/1976 | Haggerty et al. | 264/25 |
| 3,957,474 | 5/1976 | Kobayashi et al. | 156/605 X |

FOREIGN PATENT DOCUMENTS

1,226,473  3/1971  United Kingdom ............ 156/617

Primary Examiner—Wilbur L. Bascomb, Jr.
Assistant Examiner—Barry I. Hollander
Attorney, Agent, or Firm—Wilford L. Wisner; Daniel D. Dubosky

[57] ABSTRACT

There is disclosed a technique for growing, from a melt, doped single-crystal fibers for use as lasers or other active or passive optical devices of a size that is compatible with proposed optical fiber communications systems. A rod of undoped material has deposited thereon, by mechanical means, a powder or a slurry of a compound of the active ion or other dopant. A melt is formed at the end of the rod with a laser beam and a reduced diameter doped single-crystal fiber is grown or drawn from the melt by pulling with a wire or, when desired crystalline orientation is needed, by pulling with a pointed and oriented seed crystal. The pulling step, at least in the specific case of a neodymium-doped yttrium aluminum garnet (YAG) fiber, is repeated a plurality of times with approximately a 3:1 diameter reduction each time in order to obtain the desired fiber size; but only one deposition of the dopant compound is needed.

1 Claim, 7 Drawing Figures

NEODYMIUM OXIDE DOPED YTTRIUM ALUMINUM GARNET OPTICAL FIBER

BACKGROUND OF THE INVENTION

This invention relates to a technique for growth doping, or growth by pulling from a melt, of single-crystal fiber devices.

The advent of low-loss glassy material optical fibers has created interest in fiber-compatible optical devices, many of which require crystalline materials. Nevertheless, a lack of single-crystal materials with the dimensions of fibers has been an obstacle to their realization. We describe here the adaptation of a pedestal growth (modified zone melting) technique, previously used for the growth of relatively large single-crystal fibers from refractory materials for applications requiring extreme strength, to the fabrication of a single-crystal Nd:YAG fiber laser. The technique obviously is not restricted solely to the growth of YAG fiber, but also may be used with suitable materials in the fabrication of a number of single-crystal fiber-geometry optical devices including, for example, other types of lasers, modulators, switches, Raman and Brillouin amplifiers, polarizers, and three-wave-interaction and parametric devices. The small cross section of fiber permits high optical power density for nonlinear effects without overheating, and also provides opportunities for phase matching through angle (mode) matching to obtain long interaction paths; thus a number of such devices for low-power continuous-wave applications should be feasible. In the antecedent single-crystal fiber growth that preceded the discovery of our present invention, single-crystal Nd:YAG fibers were grown as follows. A preform rod about 2 millimeters square, cut from a bulk sample of 1 percent Nd-doped YAG, was fed upward into the focused beam of a $CO_2$ laser having sufficient power to melt the tip of the rod. A platinum wire 25–50 micrometers in diameter was dipped into the melt and raised slowly, pulling a crystal with an approximately round cross section from the melt. With appropriate differential feed rates for the source rod and the regrown crystal, stable growth of crystals with a diameter reduction of 2–3× from the original could be obtained. Successive regrowths have produced fibers with diameters as small as 50 micrometers and lengths to about 20 centimeters, limited only by our present equipment design. The required laser power ranged from 25–30 watts for the initial growth to 2–5 watts for the smaller sizes. At growth rates of approximately 0.5 centimeter/minutes, fibers smaller than about 250-micrometers diameter could be grown free of the cracked cores typically obtained in conventionally grown Nd:YAG. Larger fibers showed core cracking at this growth rate. Any imperfections in the fiber were highly visible during growth due to scattering of the light from the incandescent melt, and absence of visible cracking or inhomogeneities in the growing fiber could be taken as an immediate indication that a single-crystal fiber was being formed.

Nevertheless, fibers grown by that technique for laser purposes had to be grown from bulk rods which were already doped with the neodymium ion. The requirement of doping of the preform introduces an additional complication which we now recognize to be unnecessary. Indeed, more versatile techniques are desirable in order to obtain the optimum advantage from the new single-crystal fiber techniques and devices.

SUMMARY OF THE INVENTION

According to our invention, doped single-crystal fibers are grown for laser use with a modification of our above-described technique in which a suitable form of the dopant is deposited in contact with the undoped preform prior to pulling the single-crystal fiber from a melt created at one end of the preform. Our new technique can be used with crystals which are rejects from other growth processes or are pure, undoped crystals; whereas our prior technique involved the doping of large quantities of material all to a common concentration, so that potential waste was involved or a plurality of identical fibers had to be drawn. With the new technique each fiber can be provided with its own unique dopant composition and concentration.

Another aspect of the adaptability of our present invention resides in the fact that we believe it to be applicable to a large number of other crystals which could now readily be doped for laser action or active optical devices in single-crystal fiber form, regardless of the difficulties of doping some of these crystals uniformly in bulk form.

BRIEF DESCRIPTION OF THE DRAWING

Further features and advantages of our invention will become apparent from the following detailed description, taken together with the drawing, in which.

DESCRIPTION OF ILLUSTRATIVE EMBODIMENT

Figure 1:
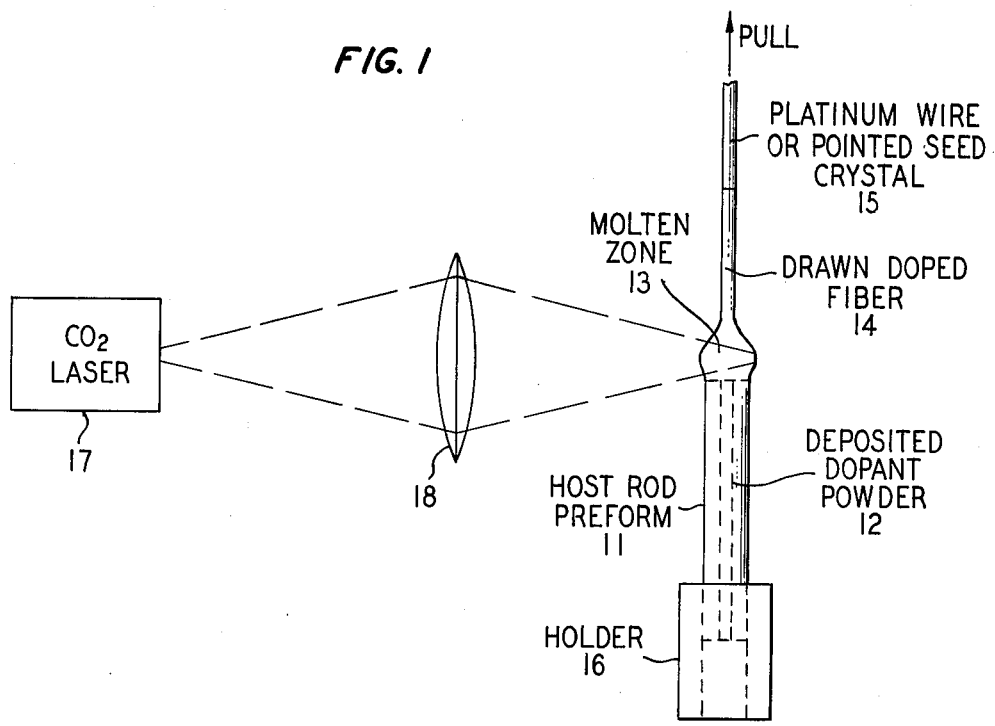
FIG. 1 is a partially pictorial and partially block diagrammatic illustration of the apparatus in which the method of the invention is practiced.
Figure 2:
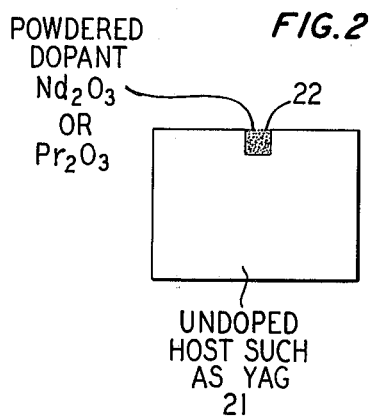
FIGS. 2, 3 and 4 show ways of depositing a suitable form of a compound of the dopant in contact with the rod prior to pulling from the melt, including grooving, hollowing out the rod axially, and depositing a powder or slurry over the entire outer surface of the preform rod.
Figure 3:
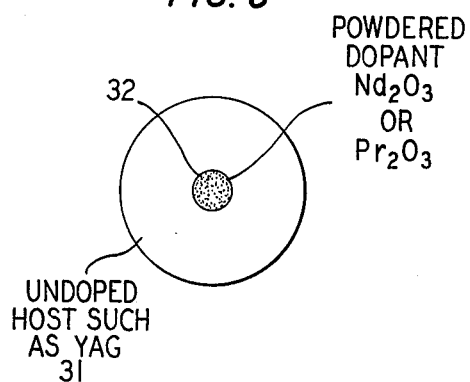

In FIG. 1 host rod or preform 11 is of the type shown in a cross section in FIG. 2 or FIG. 3 with a powder 12 of the dopant compound deposited along an axial scratch or in the hollowed-out core of the host. The preform 11 can be, for example, a neodymium doped yttrium aluminum garnet rod of the type previously used for bulk-type optically pumped neodymium ion lasers, except that the preform 11 need include nothing except yttrium aluminum garnet outside of the area of the deposited powder 12. Rod 11 is supported vertically in a conventional holder 16.

A melt is created at the end of rod 11 by a $CO_2$ laser 17, the output of which is focused by lens 18 on the end of the rod. The melt in this case takes the form of a molten zone 13 to which a platinum wire or pointed seed crystal 15 is touched. A pulling force is then applied to the wire seed crystal 15 to pull a drawn, doped single-crystal fiber 14 from the molten zone 13. The temperature in the molten zone 13 is typically of the order of 2000° C. To achieve this molten zone 13, the power output of $CO_2$ laser 17 is illustratively about 30 watts and is focused to a spot size of about 1 millimeter at the end of the rod.

The dopant is deposited in a suitable form on the undoped preform 11 in a powder or a finely-divided slurry-deposited form as shown in FIS. 2 through 4. In FI. 2 the yttrium aluminum garnet or other host 21 simply has an axial scratch or groove into which powdered neodymium oxide ($Nd_2O_3$) or praseodymium oxide ($Pr_2O_3$), for example, or other material is deposited. It is preferred that the proportion by weight of this powder to the weight of the host 21 be not more than about 5 percent and that it be distributed preferably uniformly along the axial extent of host 21.

Figure 4:
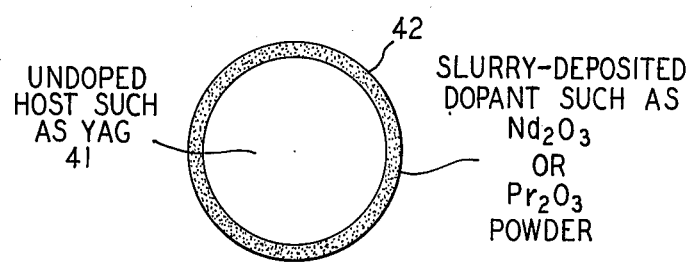

The same proportions hold for the alternative embodiments of FIGS. 3 and 4. In FIG. 3 a central axial hole is drilled through the host rod or preform 31 and the powdered oxide of the host ion is packed into that hole. In FIG. 4 the powdered oxide is suspended in a liquid such as lacquer which can be readily flowed over the surface of the yttrium aluminum garnet host 31 and which will evaporate or decompose and vaporize upon heating to the melting point of the host. If the liquid has a high coefficient of adhesion to host 41 the slurry will distribute itself substantially uniformly about the preform 41 regardless of its orientation. When the liquid has dried the $Nd_2O_3$ or $Pr_2O_3$ or other powder will be deposited over the entire surface of preform 41 and preferably will be, at least axially, substantially uniform.

In the versions of FIGS. 2 and 3, the groove or hole is preferably etched, for example, in a weak hot nitric acid or other etching solution to remove impurities introduced by the scratching, grooving or drilling process before the deposition of the powdered dopant.

One variation of the technique of our invention involves using a different compound of the active ion than the oxide, for example, some other salt of that metallic ion. In any case, the proportions of the powder to the hose should be such as to give the appropriate dopant concentration in the melt in molten zone 13. Too great a concentration of the metallic ion will lead to an increasing accumulation of that ion in zone 13 because of zone refining-type phenomena that we have found to be applicable to this process. In all the cases which we have investigated, the dopant ion appears to distribute itself throughout the regrown or drawn fiber 14 at the maximum concentration characteristic of that active ion in a single-crystal of the particular host forming rod or preform 11, provided only that sufficient dopant is supplied in the coating. A modification of these proportions is appropriate when needed to account for preferential evaporation of the dopant material or of the original host material. Zone refining can then alter the proportions to the desired final result.

Our invention now opens up the possibility of more conveniently studying various combinations of dopants in crystalline hosts to determine the most suitable combinations. Since properties of a given active ion, for example, $Nd^{3+}$, vary markedly and often unpredictably from host to host, it is of considerable interest to be able to examine as many different combinations as possible.

Examples of other host rods or preforms 11, 21, 31 and 41 which we are considering as hosts for at least the known laser ions include alumina ($Al_2O_3$), gadolinium gallium garnet, lithium niobate ($LiNbO_3$), and barium sodium niobate ($Ba_2NaNb_5O_{15}$). We do not wish to rule out other crystalline materials which can be drawn as single-crystal fibers from a melt. In all such cases we believe that the powder or slurry-deposited compound of the active ion can be distributed axially along the preform and used to produce a drawn doped fiber 14 according to our invention.

Our invention has particular application to lasers which operate in the low-loss region of optical fibers, especially 1.0 - 1.2 micrometers, and which can be pumped in a fiber compatible arrangement, particularly using high radiance light-emitting diodes operating between about 7500A and 9200A. Such an embodiment is shown in FIG. 5.

The drawn doped fiber 51, which is provided with about a 50 micrometer diameter by repetitions of the melt-forming and drawing steps, is $Nd^{3+}$-doped YAG produced according to the technique described in connection with FIG. 1 and has deposited on the polished ends thereof the reflectors 53 and 54. One end, including reflector 53, is then cemented into the substrate opening of a gallium arsenide-gallium aluminum arsenide light-emitting diode 52 so that light emitted in the area of junction 55 can be efficiently collected by the end of fiber 51 within the cement 60. The light-emitting diode 52 is energized from souce 59 through contacts 56 and 57.

Figure 5:
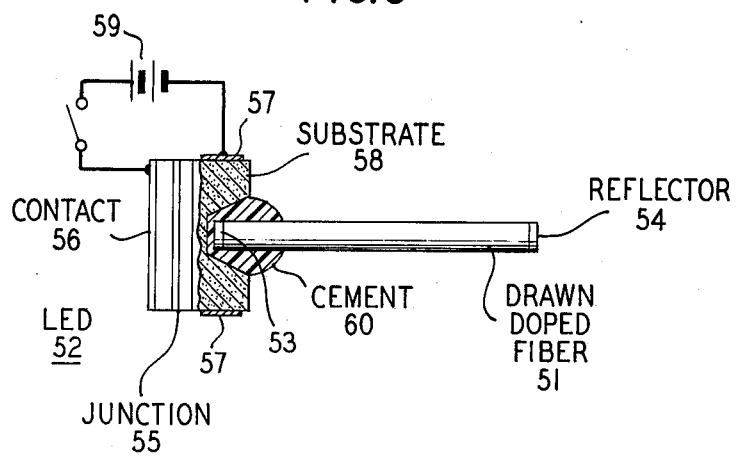
FIG. 5 shows an embodiment of a single-crystal fiber laser integrally mounted with a light-emitting diode which pumps it.

The device of FIG. 5 is a readily portable source of coherent light at about 1.05 to about 1.07 micrometers. Further, the device of FIG. 5, if fiber 51 is made sufficiently short and small in diameter, has the potential of high mode purity and high spectral purity and thus may even compete in applications in which gas lasers heretofore have been the only readily feasible source.

Figure 6:
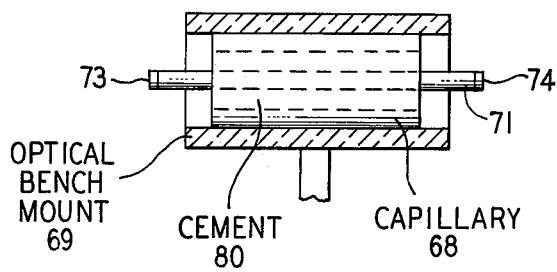
FIG. 6 shows a more conventional mounting arrangement for an optically pumped laser of the single-crystal fiber type.
Figure 7:
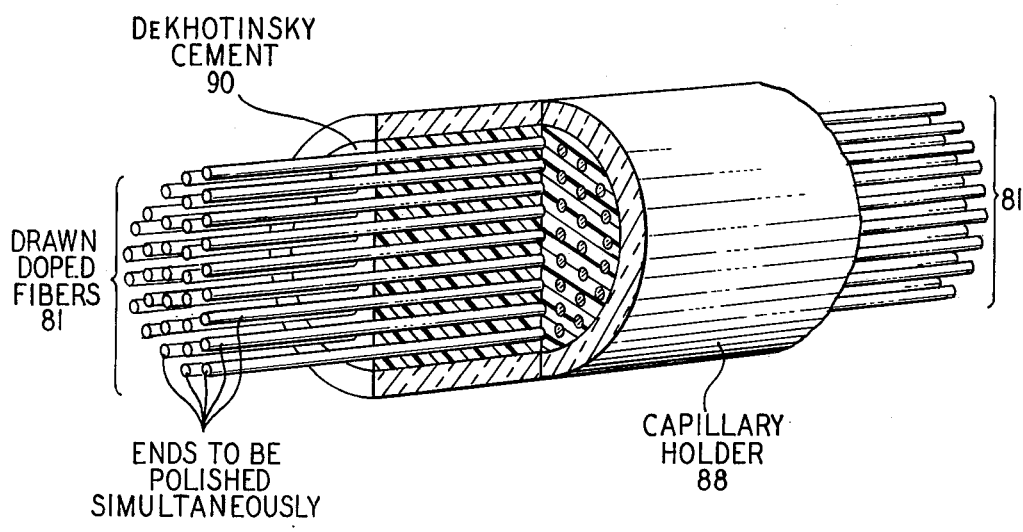
FIG. 7 shows a typical assembly of fibers grown according to the invention which are about to be end-polished.

In the alternative embodiment of FIG. 6, the drawn doped fiber 71, which is illustratively similar to fiber 14 of FIG. 1, is provided with end reflectors 73 and 74 and mounted with cement 80 in a capillary tube 68 which itself is mounted in the optical bench mount 69. The finished device may then be handled as any other device in the optical laboratory without fear of breakage, damage or necessity to use micromanipulators. It may be pumped with LEDs, or lasers such as argon ion, krypton ion dye lasers, injection lasers, flashlamps or the sun.

To polish these single-crystal fibers, it is desirable to insert a plurality 81 of them, all of which are like stiff little wires, into a capillary tube holder 88 into which they are cemented by DeKhotinsky cement or other suitalbe material. Typically, they would be cut off flush with the end of capillary holder 88 and then the entire end of the assembly would be polished, resulting in flat parallel surfaces on the ends of all the fibers 81. A like procedure would then be followed at the oher ends of the fibers to yield reflective surfaces which are parallel to the first set of polished surfaces. If it is desired to mount each fiber 81 separately, then the DeKhotinsky or other cement can be dissolved from about them readily by warm alcohol or any suitable solvent, after which they are removed from capillary holder 88.

It should be noted that, at a preferred growth rate of one half centimeter per minute for all diameters of Nd-doped YAG fibers up to about 200 micrometers, there is no crazed core in the drawn doped fiber; even though there is typically such a crazed core in the growth of larger rods of a typical host material such as yttrium aluminum garnet, particularly when that host is already doped with an active ion. In other words, below a certain diameter threshold, the apparent incompatibility of the active ion and the host becomes negligible so that preferred single crystals are thereafter obtained in the successive stages of redrawing or repulling a fiber from a melt.

It shoudl be appreciated that many modifications of our invention are possible within this scope, particularly those modifications which relate to choices of different host crystals and different active ions. Nevertheless, the basic stepts of our process can continue to be applicable and should advantageously avoid any need for doping the preform. It should also be noted that undoped preforms are of higher quality and easier to grow, in general, than doped preforms.

What is claimed is:

1. A method for drawing a craze-free single-crystal fiber of YAG (yttrium aluminum garnet) of diameter less than about 200 micrometers, doped with neodymium to a uniform concentration of about 1 percent by weight comprising the steps of:

mechanically distributing a deposit of dopant consisting of a powder or slurry of neodymium oxide over an entire axial length of a rod of YAG, the concentration of applied dopant being within the range from about 1 percent to about 5 percent by weight, creating a melt at one end of the rod by focusing a laser beam thereon, pulling a reduced diameter single-crystal rod from said melt, the ratio of the diameter of the feed rod to that of the drawn rod being less than about 3:1, repeating the above steps of melting and pulling until the rod is reduced to a fiber having a diameter of about 200 micrometers, repeating the above melting and pulling steps at a pull speed of less than about one half centimeter per minute, until the desired diameter of fiber is reached.

* * * * *